United States Patent
Tsuruoka (10) Patent No.: US 10,573,849 B2
(45) Date of Patent: Feb. 25, 2020

(54) METHOD FOR MANUFACTURING DISPLAY DEVICE

(71) Applicant: Japan Display Inc., Minato-ku (JP)

(72) Inventor: Kazuto Tsuruoka, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/619,921

(22) Filed: Jun. 12, 2017

(65) Prior Publication Data

US 2018/0083229 A1 Mar. 22, 2018

(30) Foreign Application Priority Data

Sep. 16, 2016 (JP) .................................. 2016-181819

(51) Int. Cl.
| | | |
|---|---|---|
| *H01L 51/56* | (2006.01) | |
| *H01L 27/32* | (2006.01) | |
| *H01L 51/00* | (2006.01) | |
| *H01L 51/52* | (2006.01) | |

(52) U.S. Cl.
CPC .......... *H01L 51/56* (2013.01); *H01L 27/3276* (2013.01); *H01L 51/0014* (2013.01); *H01L 51/0097* (2013.01); *H01L 51/5246* (2013.01); *H01L 2251/5338* (2013.01); *Y02E 10/549* (2013.01)

(58) Field of Classification Search
CPC . H01L 27/3276; H01L 51/56; H01L 51/0097; H01L 51/5246; H01L 51/0014; H01L 2251/5338; H01L 27/32; H01L 51/00; H01L 51/52; Y02E 10/549
See application file for complete search history.

(56) References Cited

U.S. PATENT DOCUMENTS

| | | |
|---|---|---|
| 2014/0110688 A1 | 4/2014 | Nakamura et al. |
| 2016/0190522 A1 | 6/2016 | Lee et al. |
| 2016/0204183 A1* | 7/2016 | Tao ............... H01L 51/0097 257/40 |
| 2016/0374193 A1* | 12/2016 | Namkung ........... G02F 1/1333 |
| 2017/0040406 A1* | 2/2017 | Park ............... H01L 27/3276 |

FOREIGN PATENT DOCUMENTS

| | | |
|---|---|---|
| JP | 2014-86314 | 5/2014 |
| JP | 2016-31499 A | 3/2016 |
| KR | 10-2016-0028784 A | 3/2016 |

OTHER PUBLICATIONS

Office Action dated May 8, 2018 in Korean Patent Application No. 10-2017-0074096 with English translation therein, 9 pages.
Office Action dated Nov. 26, 2018 in Korean Patent Application No. 10-2017-0074096 (with computer-generated English translation).
Office Action dated May 24, 2019, in Korean Patent Application No. 10-2017-0074096, w/Engiish-language Translation.

\* cited by examiner

*Primary Examiner* — Thanh T Nguyen
(74) *Attorney, Agent, or Firm* — Oblon, McClelland, Maier & Neustadt, L.L.P.

(57) ABSTRACT

A flexible substrate including a display area and a area to be bent, the area to be bent being provided with a wiring layer and not overlapping the display area. A first resin layer that extends along a boundary of the area to be bent and continuously surrounds the area to be bent is formed. Subsequently, a second resin layer is injected into an area surrounded by the first resin layer.

9 Claims, 12 Drawing Sheets

METHOD FOR MANUFACTURING DISPLAY DEVICE

CROSS-REFERENCE TO RELATED APPLICATION

The present application claims priority from Japanese application JP2016-181819 filed on Sep. 16, 2016, the content of which is hereby incorporated by reference into this application.

BACKGROUND OF THE INVENTION

1. Field of the Invention

The present invention relates to a method for manufacturing a display device.

2. Description of the Related Art

JP2014-086314A discloses a flexible display device. The display device includes a display element layer ("organic electroluminescent light-emitting element 30" in JP2014-086314A) in a display area for displaying an image, and flexible printed circuits (FPC) and an integrated circuit (IC) at positions that do not overlap the display area.

SUMMARY OF THE INVENTION

The inventors consider narrowing an apparent frame area when the display device is viewed from the display surface by bending a part of the frame area on the periphery of the display area. For example, an area between the display area and an area where the FPC and the IC are implemented is bent so as to hide the FPC and the IC in the back of the display device and increase the visibility of the display area.

When a part of a frame area is bent as described above, bending stress on the bent part needs to be reduced so as to prevent damage on wirings formed in the bent part (hereinafter, also referred to as area to be bent). One of the methods for reducing the stress is to form a resin layer on a area to be bent so that the neutral surface, in which expansion and contraction generated by the bend is smallest, is disposed near the wiring layer. In this regard, however, if the resin layer formed on the area to be bent is uneven, the neutral surface also has unevenness. As such, when the area to be bent is bent, a local stress is applied to the wiring layer and damages the wiring layer.

One or more embodiments of the present invention have been conceived in view of the above, and an object thereof is to provide a method for manufacturing a display device that prevents a wiring layer from being damaged when the display device is bent at a area to be bent.

A method for manufacturing a display device according to an embodiment of the present invention includes the steps of preparing a structure including a display area and a area to be bent, the display area being provided with a display element layer that emits light of a plurality of pixels, the area to be bent being provided with a wiring layer and not overlapping the display area, forming a first resin layer that extends along a boundary of the area to be bent, and extends continuously surrounds the area to be bent, and injecting, after the forming step, a second resin layer in an area surrounded by the first resin layer. This configuration can prevent the wiring layer from being damaged when the display device is bent in the area to be bent.

DETAILED DESCRIPTION OF THE INVENTION

Embodiments of the present invention will be described below in detail. In this regard, the embodiments disclosed in the present specification are just examples of the present disclosure, and any modifications of the present disclosure easily devised by a person skilled in the art fall within the scope of the claims. Further, the widths, thicknesses, shapes, or other characteristics of each part in the drawings are schematically illustrated for clarity of illustration compared to actual configurations, and should not be understood to limit the interpretation of the present disclosure. In the present specification and drawings, some elements identical or similar to those shown previously are denoted by the same reference signs as the previously shown elements, and thus repetitive detailed descriptions of them may be omitted as appropriate.

Further, in the embodiments, if not otherwise stated, the words "on" and "below" suggest not only a case where a component is disposed immediately on or below another component, but also a case where the component is disposed on or below the another component with a third component interposed therebetween.

Figure 1:
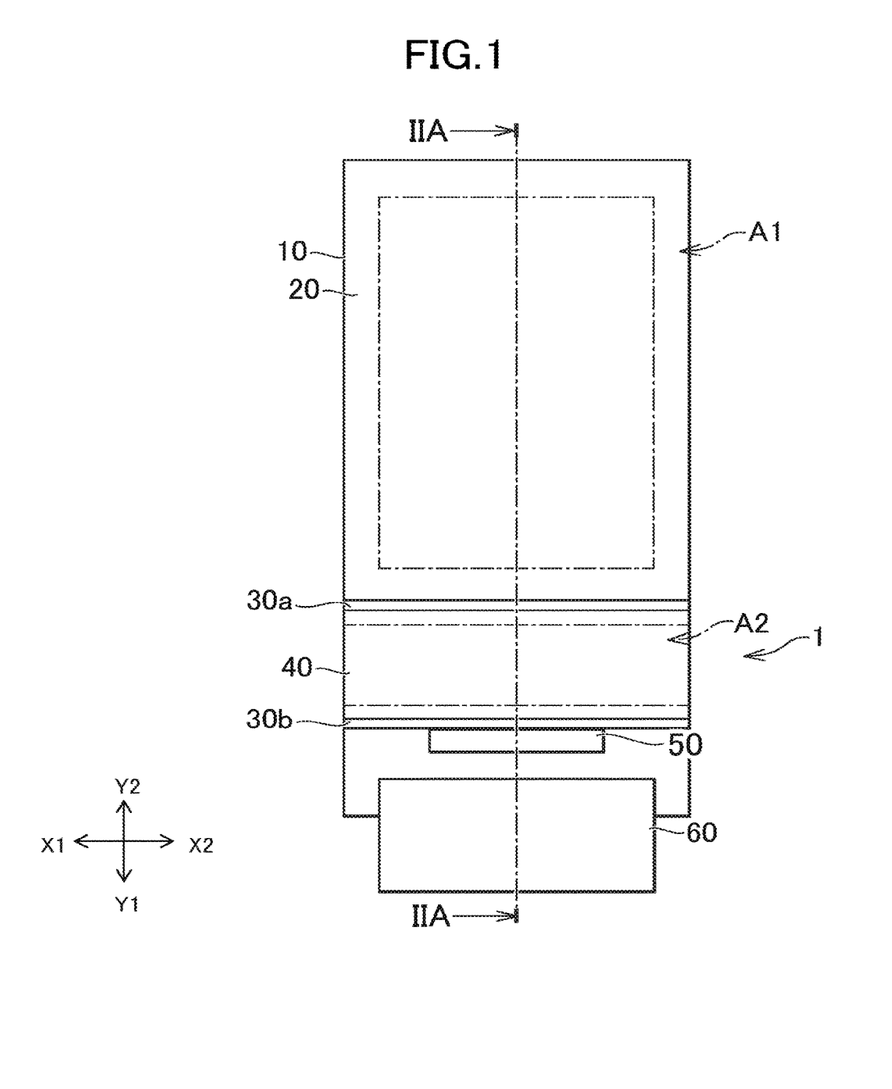
FIG. 1 is a schematic top view of a display device 1 according to an embodiment.
Figure 2A:
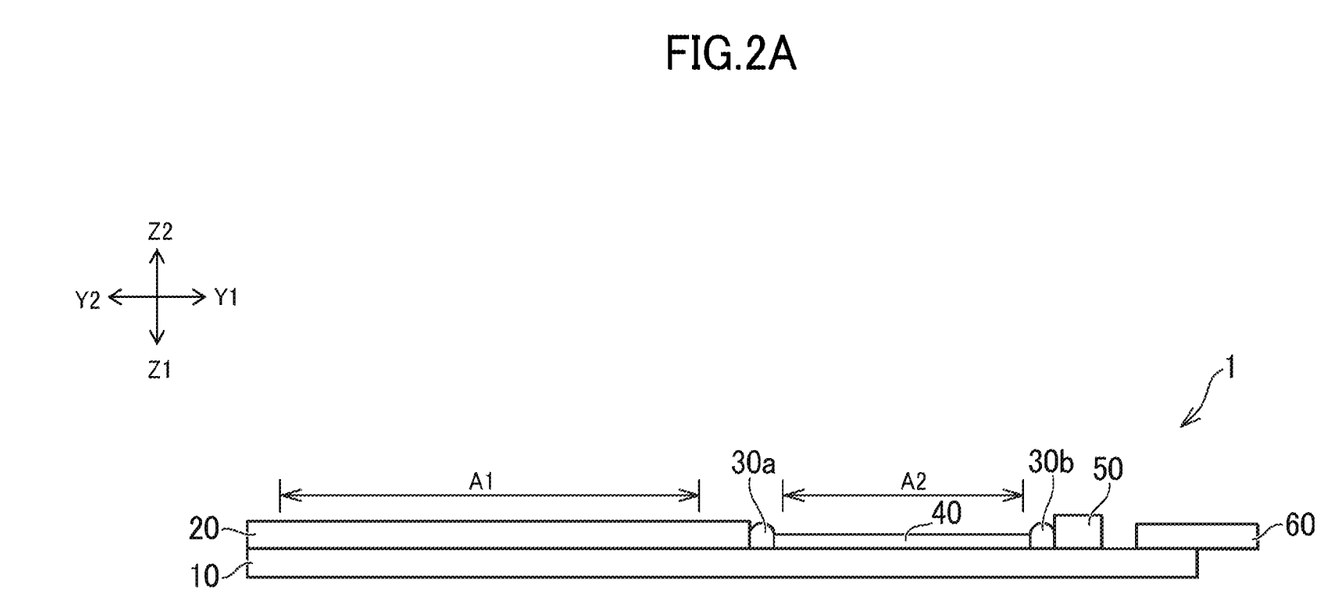
FIG. 2A is a schematic cross-sectional view of the display device according to an embodiment.
Figure 2B:
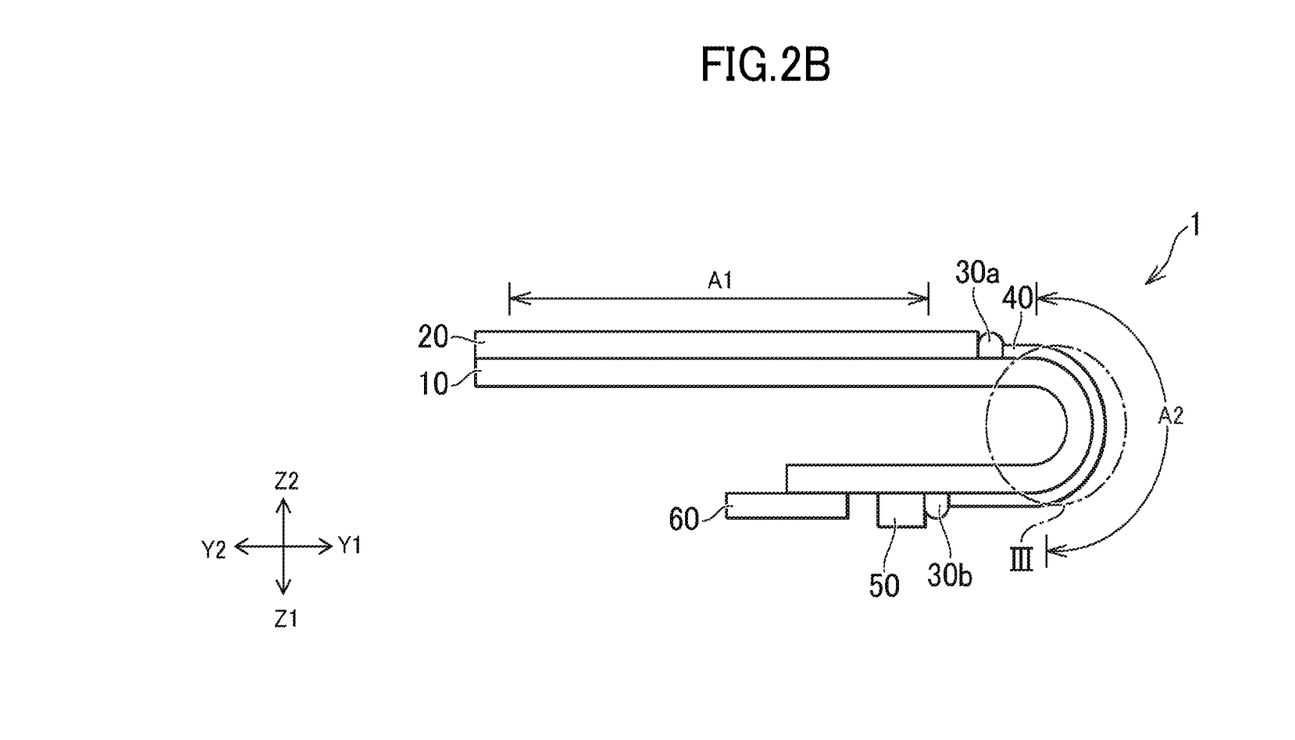
FIG. 2B is a schematic cross-sectional view of the display device according to an embodiment.
Figure 3:
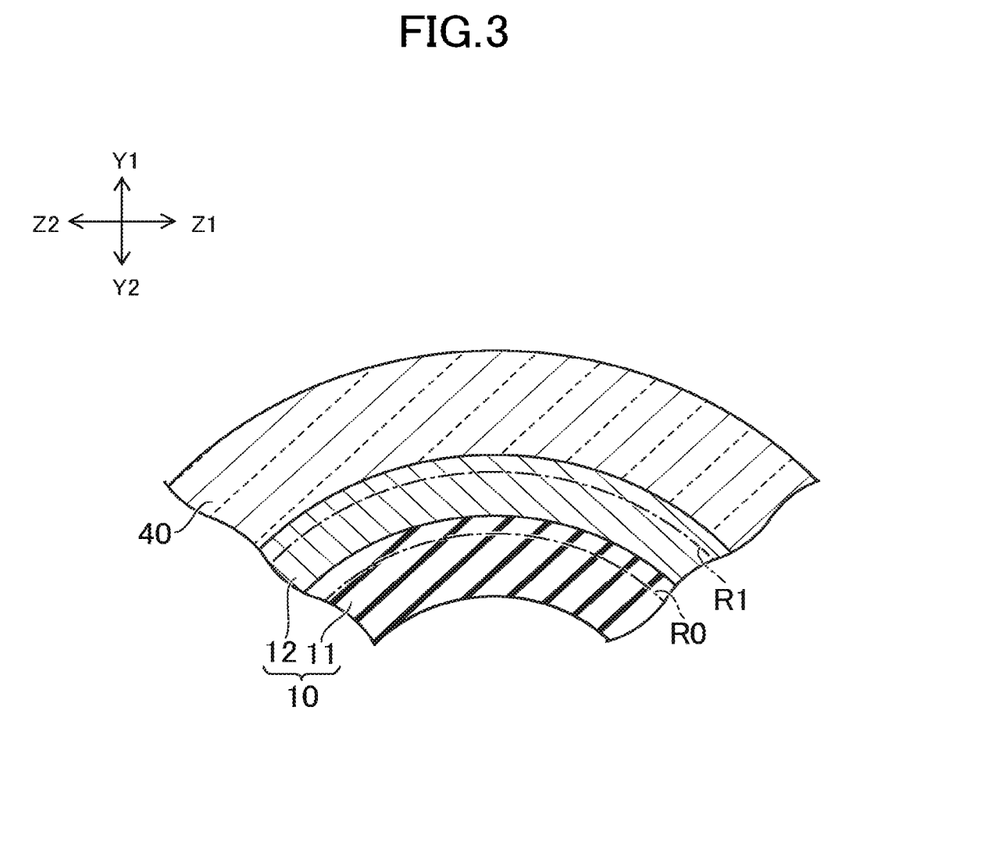
FIG. 3 is a schematic cross-sectional view of a area to be bent of the display device according to an embodiment.
Figure 4:
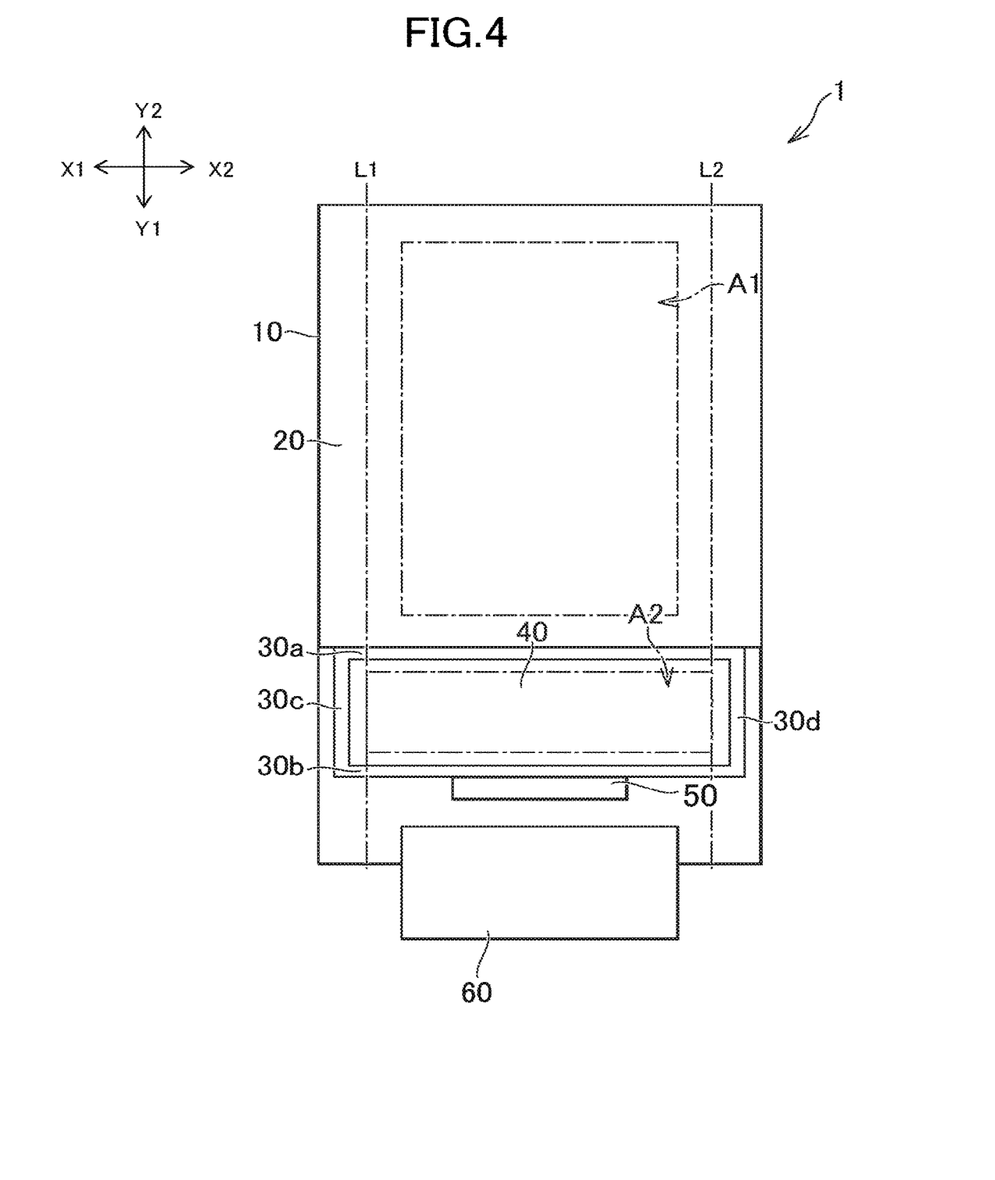
FIG. 4 is a schematic top view of the display device in a manufacturing process.

FIG. 1 is a schematic top view of a display device 1 according to the present embodiment. FIG. 2A is a schematic cross-sectional view of the display device 1 taken along the line IIA-IIA in FIG. 1. FIG. 2B is a schematic cross-sectional view of the display device 1 when being bent. FIG. 3 is a diagram explaining a neutral surface of the display device 1 when being bent, and an enlarged view of a portion indicated by the line III shown in FIG. 2B. FIG. 4 is a diagram explaining a manufacturing process of the display device 1. In the following, a positional relationship between elements by using X-axis (X1 direction, X2 direction), Y-axis (Y1 direction, Y2 direction), and Z-axis (Z1 direction, Z2 direction) coordinates.

[1. Configuration of Display Device]

As shown in FIG. 1, the display device 1 according to this embodiment includes a display area A1 for displaying images and a area to be bent A2 in which the display device 1 is bent. The display area A1 and the area to be bent A2 are disposed so as not to overlap each other, and the area to be bent A2 is provided on the Y1 direction side of the display area A1. An integrated circuit (IC) 50 and a flexible printed circuit (FPC) 60 are attached to the side (Y1 direction side) opposite to the side (Y2 direction side) where the display area A1 of the area to be bent A2 is disposed.

In the present embodiment, the area to be bent A2 is rectangular. Specifically, the boundary of the area to be bent A2 in the X1 direction side and the boundary of the area to be bent A2 in the X2 direction side are respectively disposed on the edge of the display device 1 in the X1 direction side and the edge of the display device 1 in the X2 direction side. Further, the boundary of the area to be bent A2 in the Y2 direction side and the boundary of the area to be bent A2 in the Y1 direction side both extend in the X-axis direction.

As shown in FIGS. 1 and 2A, the display device 1 includes a flexible substrate 10. The flexible substrate 10 includes a flexible sheet substrate 11 (see FIG. 3), a display element layer (not shown) for displaying an image on the display area A1, and a wiring layer 12 (see FIG. 3) extending in the Y-axis direction across the area to be bent A2.

The sheet substrate 11 is formed of resin material such as polyimide, and formed substantially over the entire area of the display device 1 in a plan view.

The display element layer emits light of a plurality of pixels in the display area A1. In this embodiment, the display element layer is formed on the sheet substrate 11 (more specifically, in the Z2 direction side), and covers the entire display area A1. In this regard, the display element layer does not cover the area to be bent A2. The display element layer includes, for example, a thin film transistor (TFT), a lower electrode electrically connected to the TFT, an upper electrode formed on the lower electrode, and an organic layer formed between the lower electrode and the upper electrode. The organic layer includes at least a light-emitting layer, and may further include at least one of an electron transport layer, a hole transport layer, an electron injection layer, and a hole injection layer. A color filter layer passing light at a predetermined wavelength and a counter substrate including an overcoat layer may be provided on the display element layer. In this case, a transparent filler may be provided between the counter substrate and the sheet substrate 11.

The wiring layer 12 is formed on the sheet substrate 11, and extends across the area to be bent A2. The wiring layer 12 includes wiring formed along the Y-axis direction across the area to be bent A2. The wiring included in the wiring layer 12 electrically connects the TFT included in the display element layer in the display area A1 to the IC 50 or the FPC 60.

A protective film 20 is provided on the flexible substrate 10. More specifically, the protective film 20 is adhered to the display element layer included in the flexible substrate 10, covers the display area A1, and does not cover the area to be bent A2. The protective film 20 may be formed of PET, for example. The protective film 20 maybe adhered to the surface of the flexible substrate 10 through a double-sided adhesive sheet (not shown), or applied with an adhesive on the surface to be adhered to the flexible substrate 10. A polarizing plate maybe provided on the flexible substrate 10. The polarizing plate may be adhered to the surface of the protective film 20, or adhered to the surface of the flexible substrate 10 instead of the protective film 20. In this case, the polarizing plate may be adhered so as to cover the display area A1 and not to cover the area to be bent A2.

On the flexible substrate 10, first resin layers 30a and 30b and a second resin layer 40 are formed. The second resin layer 40 covers the entire area to be bent A2, and does not cover the display area A1. The first resin layers 30a and 30b are disposed so as not to overlap the area to be bent A2. More specifically, the first resin layer 30a is formed on the edge of the second resin layer 40 in the Y2 direction side, and the first resin layer 30b is formed on the edge of the second resin layer 40 in the Y1 direction side. The first resin layers 30a and 30b are continuously provided along the X-axis direction across the display device 1.

As shown in FIG. 2B, the display device 1 is bendable in the Y-axis direction on the area to be bent A2. As described, the area to be bent A2 of the display device 1 is bent so as to apparently narrow an area (so-called frame area) outside the display area A1 and hide the IC 50 and the FPC 60 in the back of the display device 1.

As shown in FIG. 3, the wiring layer 12 of the flexible substrate 10 is formed on the sheet substrate 11 in the area to be bent A2. The wiring layer 12 is thinner than the sheet substrate 11. As such, if there is no second resin layer 40, the neutral surface R0, which has the smallest expansion and contraction due to the bending, is not formed in the wiring layer 12 but in the sheet substrate 11. In this case, when the display device 1 is bent, the wiring layer 12 is applied with the stress due to the tension, and thus the wiring layer 12 maybe damaged and the wiring included in the wiring layer 12 may be broken.

As such, in this embodiment, the second resin layer 40 is formed on the flexible substrate 10 in the area to be bent A2. This allows the neutral surface R1, which has the smallest expansion and contraction due to the bending, to be formed in the wiring layer 12, and the stress to the wiring layer 12 when the display device 1 is bent can be reduced. In this regard, if the second resin layer 40 formed on the area to be bent A2 is uneven, the neutral surface R1 also has unevenness. As such, a local stress is applied to the wiring layer 12, and thus the wiring layer 12 may be damaged. For this reason, the second resin layer 40 is desirably formed to have an even, flat surface.

[2. Manufacturing Method of Display Device]

In the following, a method for manufacturing the display device 1 according to this embodiment will be discussed. The manufacturing process of the display device 1 includes a step of preparing a flexible substrate 10, a step of forming a first resin layer 30 on the flexible substrate 10, a step of forming first resin layers 30a to 30d on the flexible substrate 10, a step of injecting a second resin layer 40, and a step of cutting the flexible substrate 10 along cutting lines L1 and L2.

[2-1. Configuration of Flexible Substrate at Manufacturing Stage]

In the manufacturing process of the display device 1 according to this embodiment, the flexible substrate 10, which is a structure including the display area A1 and the area to be bent A2, is prepared first. As described above, the display element layer that emits light of the pixels is formed on the display area A1 of the flexible substrate 10, and the wiring layer 12 is formed on the area to be bent A2. The protective film 20 (or polarizing plate), which covers the display area A1, is adhered to the flexible substrate 10 in advance, and the IC 50 and the FPC 60 are attached to the flexible substrate 10 on the opposite side of the display area A1 (Y1 direction side) across the area to be bent A2. The wiring layer 12 is disposed across the area to be bent A2 in the Y-axis direction, and electrically connects the TFT included in the display area A1 to the IC 50 or the FPC 60.

The flexible substrate 10 in the manufacturing stage of the display device 1 is wider in the X-axis direction than that of the display device 1 of the final product, and is formed on the rectangular area to be bent A2 in both of the X1 direction side and the X2 direction side. In other words, the flexible substrate 10 contains the area to be bent A2 in a plan view.

[2-2. Step of Forming First Resin Layer 30]

Subsequently, as shown in FIG. 4, the first resin layers 30a to 30d, which extend along the boundary of the area to be bent A2 and continuously surround the area to be bent A2, are formed. More specifically, the first resin layer 30a extending along the boundary in the Y2 direction, the first resin layer 30b extending along the boundary in the Y1 direction, the first resin layer 30c extending along the boundary in the X1 direction, and the first resin layer 30d extending along the boundary in the X2 direction are formed. The first resin layers 30c and 30d are connected to the first resin layers 30a and 30b, and the first resin layers 30a to 30d (hereinafter simply referred to as first resin layers 30) form one frame.

In this embodiment, as shown in FIGS. 4 and 2A, the first resin layer 30a is in contact with the protective film 20 (or polarizing plate). Further, the first resin layer 30b is in contact with the IC 50. This configuration improves adhesion of the first resin layer 30a and the first resin layer 30b to the protective film 20 and the IC 50, and prevents the protective film 20 and the IC 50 from coming off.

[2-3. Steps of Injecting Second Resin Layer 40]

Next, as shown in FIG. 4, the second resin layer 40 is injected into the area surrounded by the first resin layers 30. With this configuration, the second resin layer 40 stays within the frame formed by the first resin layers 30 and does not spread beyond the frame. As such, the second resin layer 40 can be formed in flat and even thickness.

The second resin layer 40 thus injected is required not to exceed the height of the frame formed by the first resin layers 30. As such, as shown in FIG. 2A, the thickness of the injected second resin layer 40 in the Z-axis direction is smaller than the thickness of the first resin layer 30. The thickness of the second resin layer 40 may be appropriately determined in accordance with a type of a resin material (more specifically, Young's modulus and ensile modulus of a resin material). Here, the appropriate thickness of the second resin layer 40 may be determined so that the neutral surface R1 is formed in the wiring layer 12 when the display device 1 is bent (see FIG. 3).

The second resin layer 40 needs to be formed to have an even thickness and a flat surface so as to prevent a local stress from being applied when the display device 1 is bent. As such, in this embodiment, the viscosity of the second resin layer 40 before curing is lower than the viscosity of the first resin layer 30 before curing.

After the second resin layer 40 is injected, the first resin layer 30 and the second resin layer 40 are cured. The method for curing may be appropriately selected in accordance with the material of the resin layers 30 and the resin layer 40. For example, the method may use lapse of time, volatilization of a solvent, light such as UV, and thermally-driven reaction, or a combination of these.

[2-4. Step of Cutting Flexible Substrate 10]

Subsequently, as shown in FIG. 4, the flexible substrate 10 is cut along the cutting lines L1 and L2 that overlap the second resin layer 40. The cutting lines L1 and L2 extend along one of the boundaries of the area to be bent A2. That is, the cutting lines L1 and L2 extend in the Y-axis direction, and form the respective edges of the display device 1 after being cut in the X1 direction side and the X2 direction side. This configuration enables to cut off the first resin layers 30c and 30d, which extend in the Y-axis direction among the first resin layers 30, and eliminate the first resin layers 30 that are not flat from the area where the display device 1 is bent. In other words, this configuration ensures that the display device 1 is not prevented from being bent.

As described above, in the manufacturing process of the display device 1 according to this embodiment, the first resin layers 30 that continuously cover the area to be bent A2 are formed, and the second resin layer 40 is injected into the area surrounded by the first resin layers 30. This configuration allows the second resin layer 40 to be formed in flat and even thickness in the area to be bent A2, and prevents the wiring layer 12 from being damaged when the display device 1 is bent in the area to be bent A2.

[3. Variations]

The present invention is not limited to the above described embodiment and may be modified in various manners. In the following, examples of other manners (variations) in which the present invention is implemented will be discussed.

[3-1. First Variation]

Figure 5:
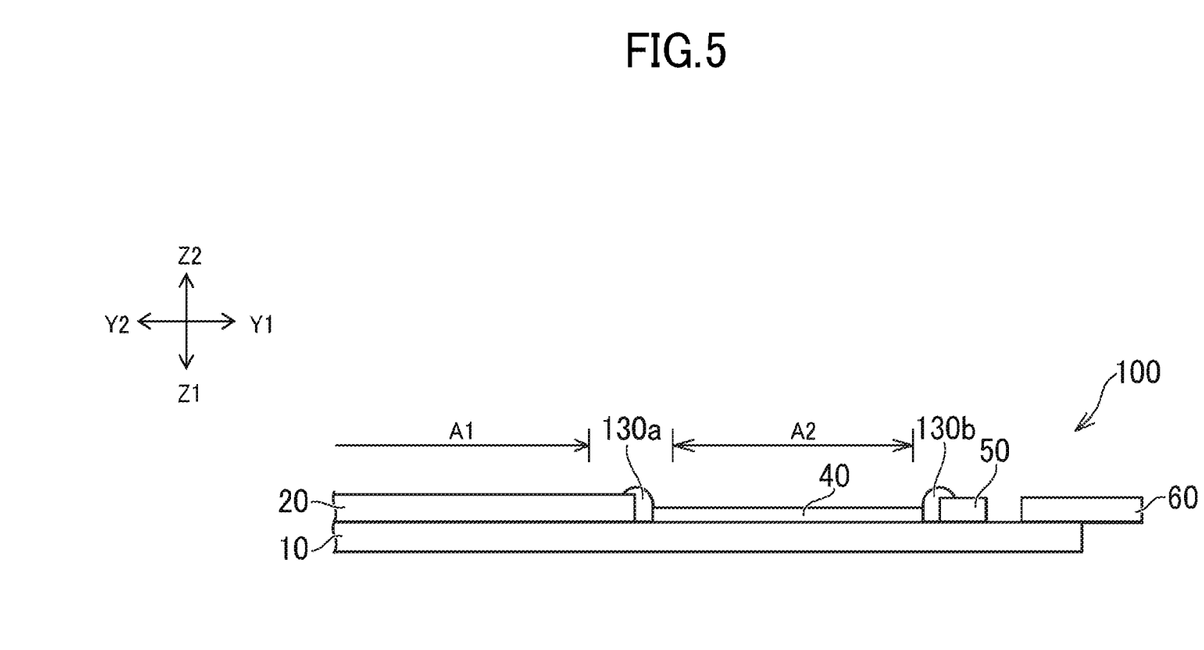
FIG. 5 is a schematic cross-sectional view of the display device according to the first variation.

FIG. 5 is a schematic cross-sectional view of the display device 100 according to the first variation. As shown in FIG. 5, the first resin layer 130 formed in the Y2 direction side of the area to be bent A2 may be disposed on the edge of the protective film 20 (or polarizing plate) in the Y1 direction side so as to cover the edge. Similarly, the first resin layer 130b formed in the Y1 direction side of the area to be bent A2 may cover the edge of the IC 50 in the Y2 direction side. This configuration improves adhesion of the protective film 20 and the IC 50 to the flexible substrate 10.

[3-2. Second Variation]

Figure 6A:
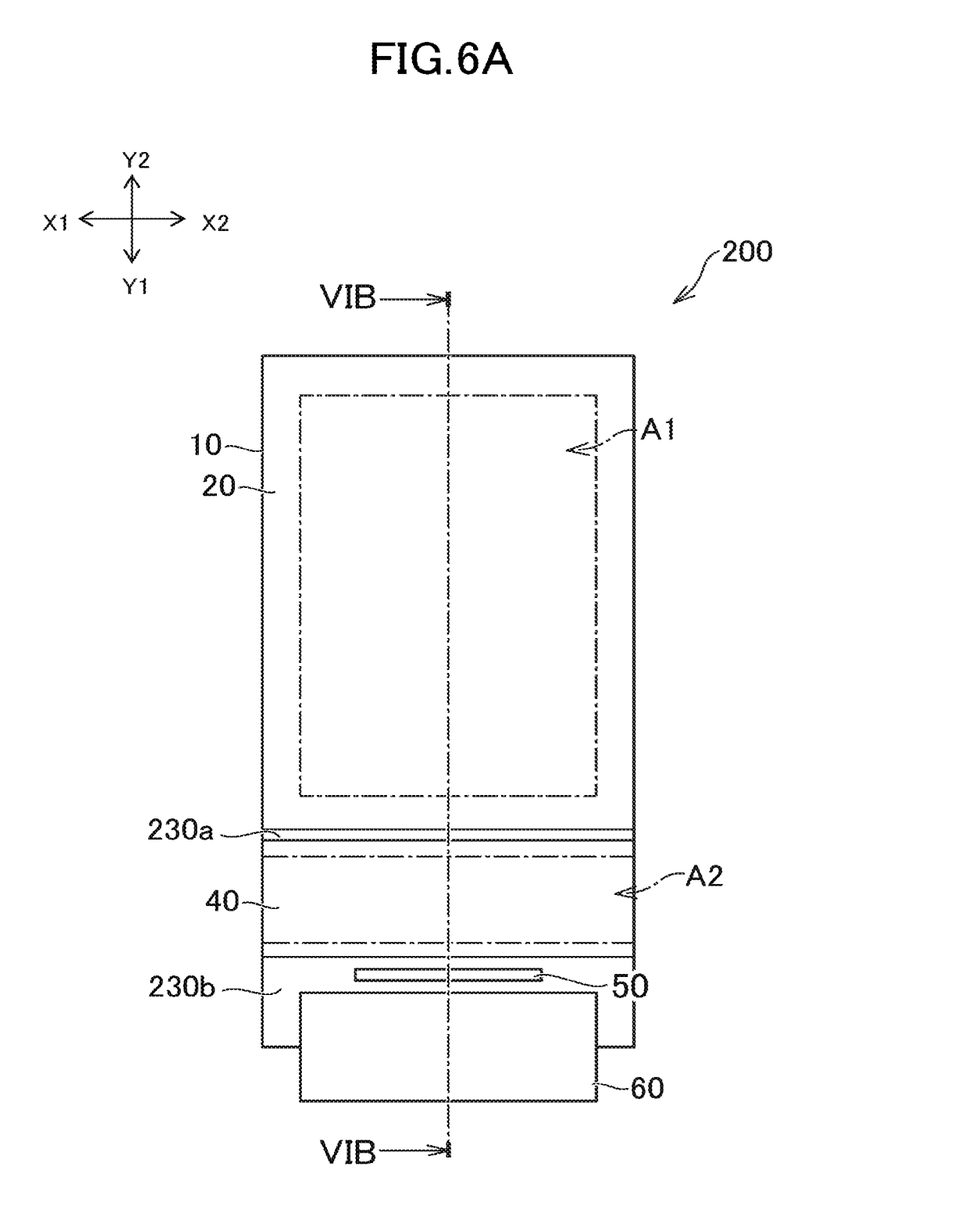
FIG. 6A is a schematic top view of the display device according to the second variation.
Figure 6B:
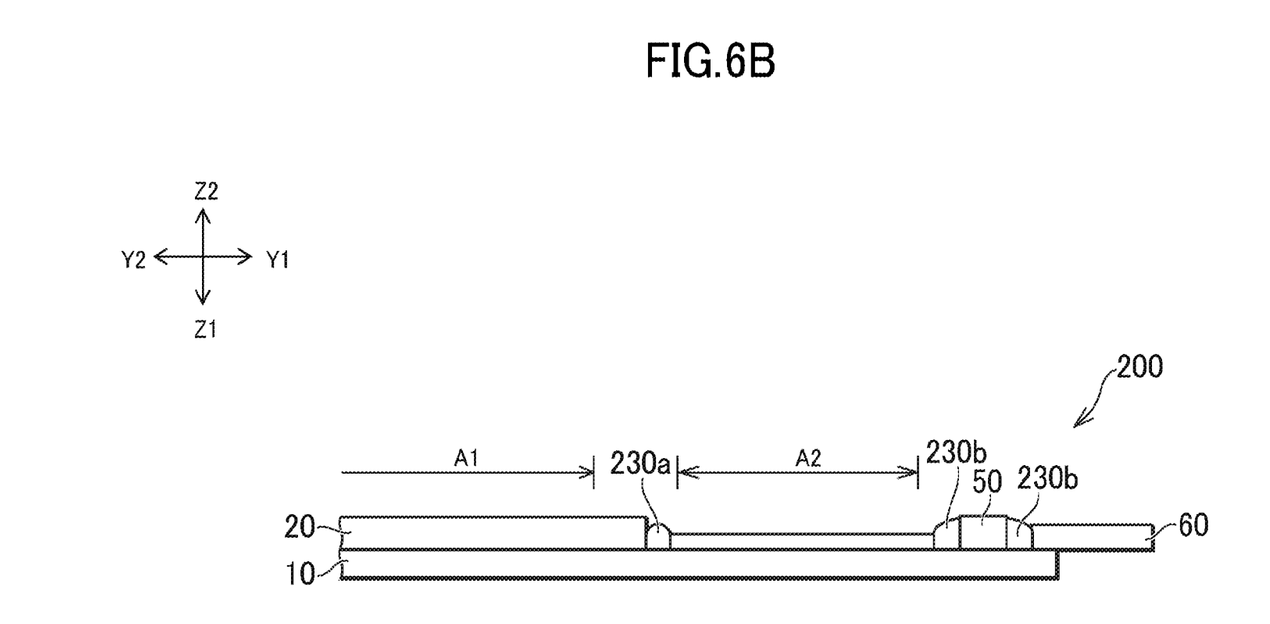
FIG. 6B is a schematic cross-sectional view of the display device according to the second variation.

FIG. 6A is a schematic top view of a display device 200 according to the second variation. FIG. 6B is a cross-sectional view of the display device 200 according to the second variation, and illustrates the cut plane indicated by the line VIB-VIB in FIG. 6A. As shown in FIGS. 6A and 6B, a first resin layer 230b formed in the Y1 direction side of the area to be bent A2 continuously surround the periphery of the IC 50 in a plan view and is in contact with the periphery of the IC 50. Specifically, the first resin layer 230b is continuously in contact with edges of the IC 50 in the X1 direction side, the X2 direction side, the Y1 direction side, and the Y2 direction side. This also improves the adhesion of the IC 50.

[3-3. Third Variation]

Figure 7A:
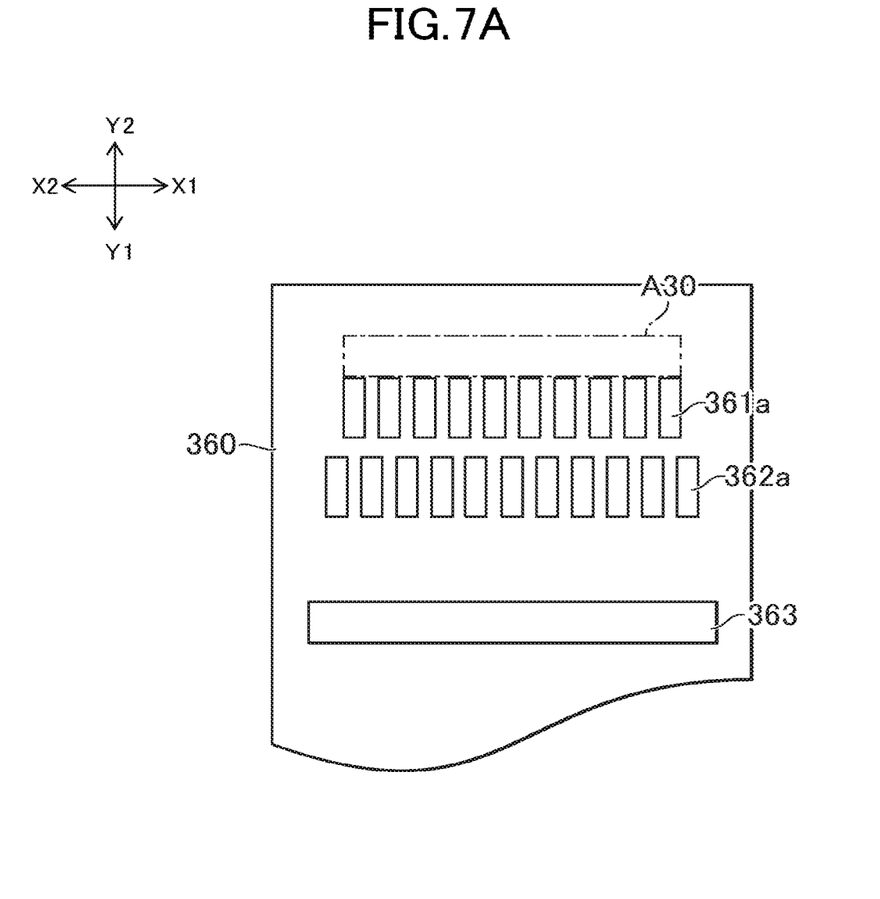
FIG. 7A is a schematic top view of an FPC according to the third variation.
Figure 7B:
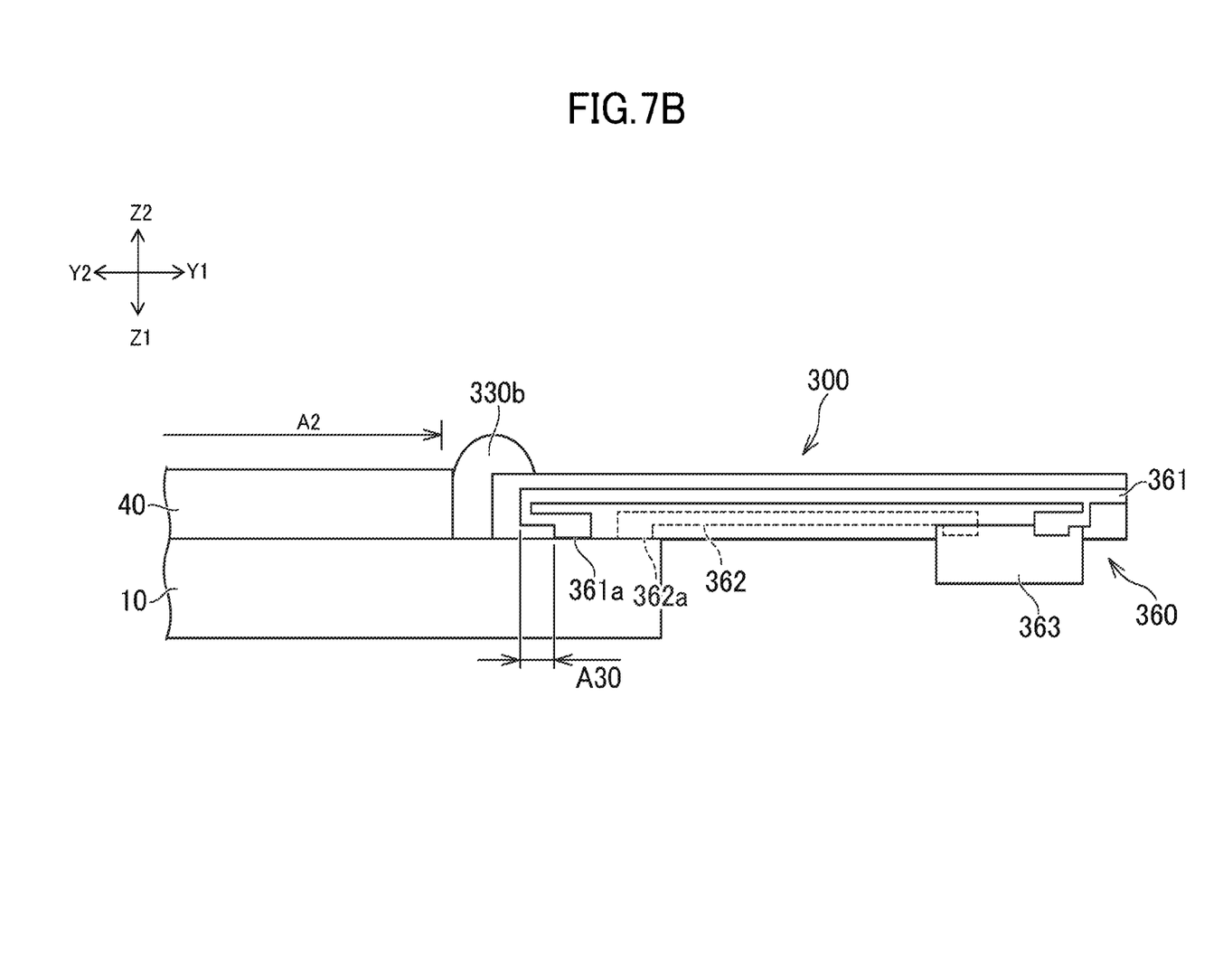
FIG. 7B is a schematic cross-sectional view of the display device according to the third variation.

FIG. 7A is a schematic top view of an FPC 360 according to the third variation. FIG. 7B is a schematic cross-sectional view of a display device 300 according to the third variation. As shown in FIG. 7B, the FPC 360 according to the third variation includes first conductive wires 361, second conductive wires 362, and an IC 363. The first and second conductive wires 361 and 362 are connected to the IC 363.

As shown in FIG. 7A, connected areas 361a where the first conductive wires 361 are exposed and connected areas 362a where the second conductive wires 362 are exposed are formed on the surface of the FPC 360 in the Z1 direction side. Specifically, the connected areas 361a including the first conductive wires 361 are aligned along a line in the X-axis direction, and the connected areas 362a including the second conductive wires 362 are also aligned along a line in the X-axis direction. The connected areas 361a are disposed in the X-axis direction at positions different from positions of the connected areas 362a, and the connected areas 361a and 362a are arranged in a staggered pattern.

As shown in FIG. 7B, the FPC 360 includes a folding area A30 in which the first conductive wires 361 extend from the connected areas 361a in the Y2 direction, and folds back from the extended edge to the connected areas 361a.

The FPC 360 is attached to the flexible substrate 10 on the opposite side of the display area A1 across the area to be bent A2, and the first and second conductive wires 361 and 362 included in the FPC 360 are electrically connected to the wiring layer included in the flexible substrate 10. In this variation, a first resin layer 330b is in contact with the folding area A30 of the FPC 360. In this way, the first resin layer 330b is formed to be in contact with the folding area A30 of the FPC 360, and thus the first resin layer 330b can cover the FPC 360 in the Z2 direction to improve adhesion of the FPC 360.

[3-4. Fourth Variation]

Figure 8A:
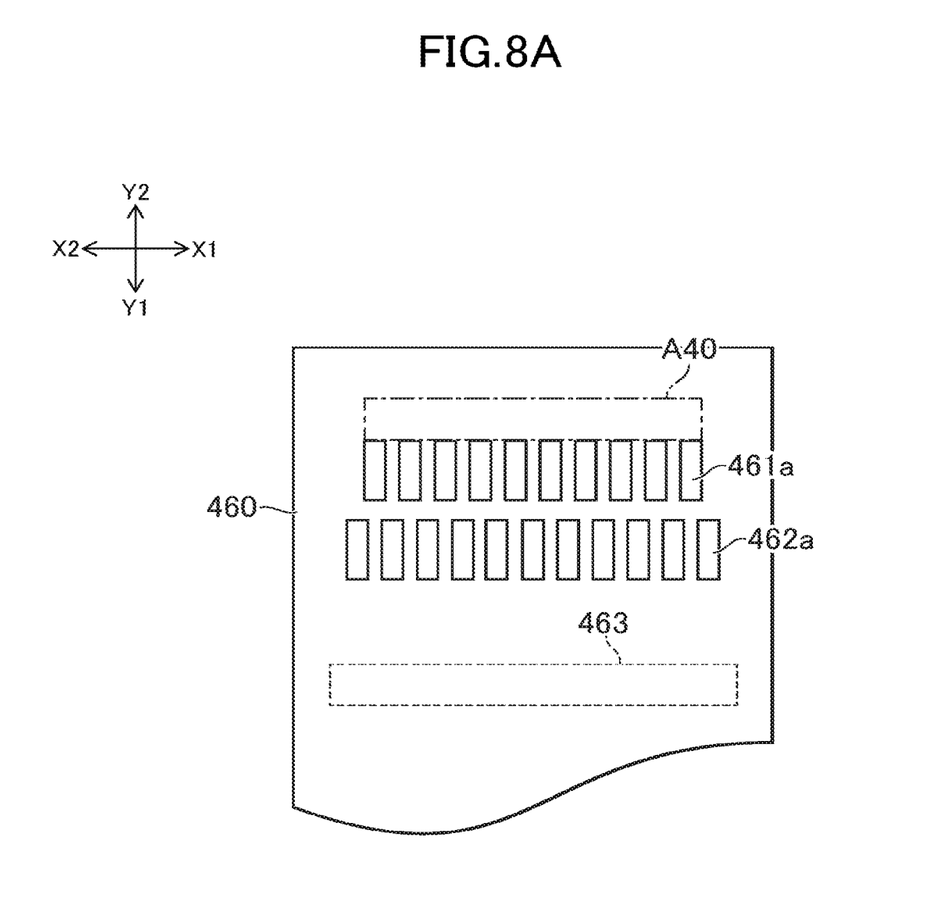
FIG. 8A is a schematic top view of the FPC according to the fourth variation.
Figure 8B:
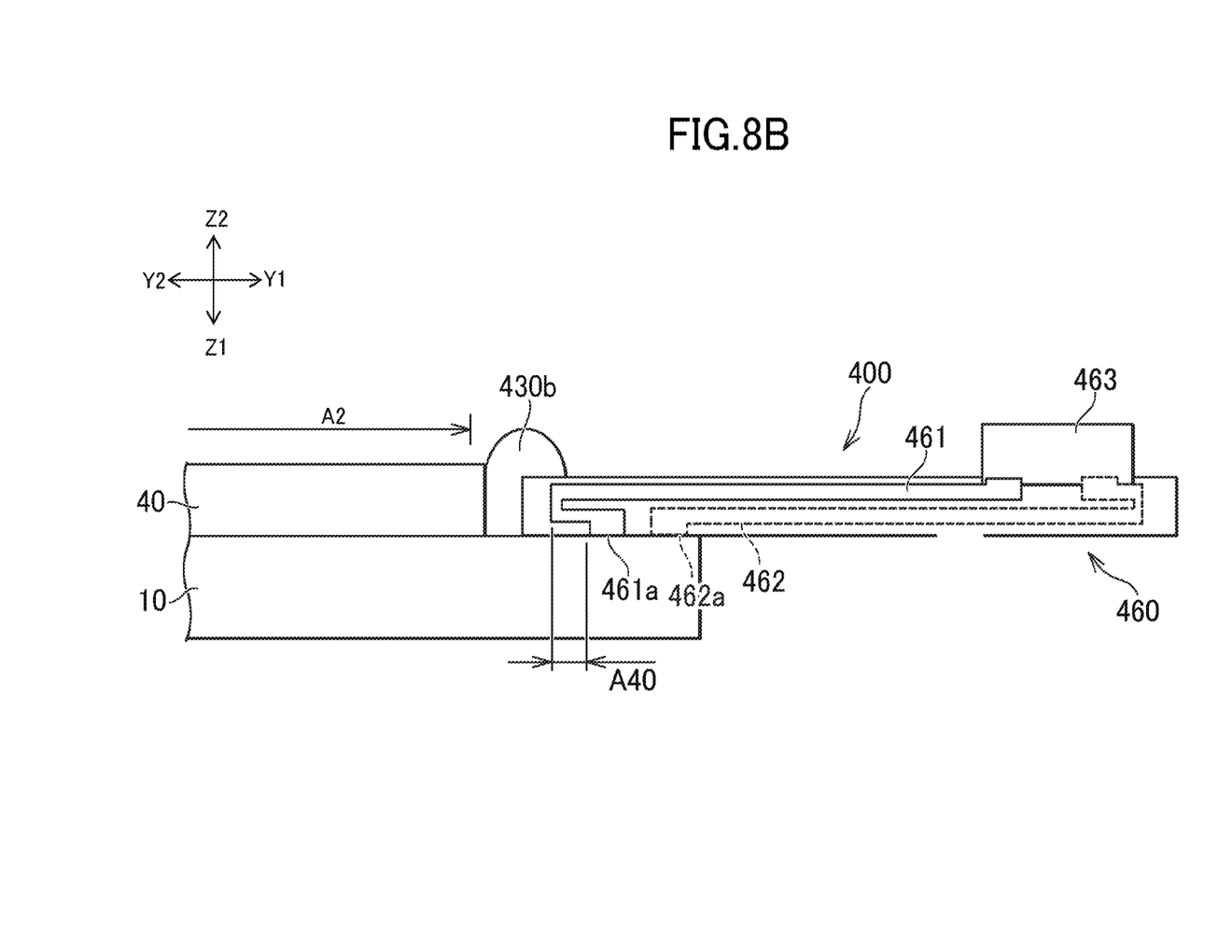
FIG. 8B is a schematic cross-sectional view of the display device according to the fourth variation.

FIG. 8A is a schematic top view of an FPC 460 according to the fourth variation. FIG. 8B is a schematic cross-sectional view of a display device 400 according to the fourth variation. As shown in FIGS. 8A and 8B, the FPC 460 according to this variation includes first conductive wires 461, second conductive wires 462, and an IC 463. The first and second conductive wires 461 and 462 are exposed on the surface of the FPC 460 in the Z1 direction side, and thereby the connected areas 461a and 462a are formed.

In this variation, the IC 463 implemented in the FPC 460 is attached to the surface on the side opposite to the side where the connected areas 461a and 462a are exposed (i.e., surface on the Z1 direction side). However, in this variation as well, the FPC 460 includes a folding area A40 in which the first conductive wires 361 extending from the connected areas 361a fold back to the connected areas 361a. Here, a first resin layer 430b is in contact with the folding area A40 of the FPC 460, and thus, similarly to the third variation, the first resin layer 430b covers the FPC 460 to improve adhesion of the FPC 460.

What is claimed is:

1. A method for manufacturing a display device comprising:
   preparing a structure including a display area and an area to be bent, the display area being provided with a display element layer that emits light of a plurality of pixels, the area to be bent being provided with a wiring layer and not overlapping the display area;
   forming a first resin layer that extends along a boundary of the area to be bent including a side extending in one direction, and extends continuously surrounds the area to be bent;
   injecting, after the forming, a second resin layer in an area surrounded by the first resin layer;
   cutting, after the injecting, the structure along a cutting line that extends in the one direction and overlaps the second resin layer.

2. The method for manufacturing the display device according to claim 1, wherein
   viscosity of the second resin layer before curing is lower than viscosity of the first resin layer before curing.

3. The method for manufacturing the display device according to claim 1, wherein
   a thickness of the second resin layer which is injected is smaller than a thickness of the first resin layer.

4. The method for manufacturing the display device according to claim 1, further comprising, before the forming, adhering a film to cover the display area of the structure, wherein
   the first resin layer is in contact with the film.

5. The method for manufacturing the display device according to claim 1, further comprising attaching an integrated circuit to an area of the structure opposite to the display area across the area to be bent, the integrated circuit electrically connecting to the wiring layer, wherein
   the first resin layer is in contact with the integrated circuit.

6. The method for manufacturing the display device according to claim 5, wherein
   the first resin layer continuously surrounds a periphery of the integrated circuit in a plan view.

7. The method for manufacturing the display device according to claim 1, further comprising attaching a flexible printed circuit to an area in the structure opposite to the display area across the area to be bent, the flexible printed circuit electrically connecting to the wiring layer, wherein
   the first resin layer is in contact with the flexible printed circuit.

8. The method for manufacturing the display device according to claim 7, wherein
   a connected area and a folding area are formed in the flexible printed circuit, the connected area being an area where a conductive wire exposes, the folding area being an area that is folded back so that the conductive wire extending from the connected area is directed to the connected area, and
   the first resin layer is in contact with the folding area of the flexible printed circuit.

9. A method for manufacturing a display device comprising:
   preparing a structure including a display area and an area to be bent, the display area being provided with a display element layer that emits light of a plurality of pixels, the area to be bent being provided with a wiring layer and not overlapping the display area;
   forming a first resin layer that extends along a boundary of the area to be bent, and extends continuously surrounds the area to be bent;
   injecting, after the forming, a second resin layer in an area surrounded by the first resin layer, viscosity of the second resin layer before curing is lower than viscosity of the first resin layer before curing.

* * * * *